United States Patent
Yamada et al.

(10) Patent No.: US 8,598,770 B2
(45) Date of Patent: Dec. 3, 2013

(54) RESONATOR ELEMENT HAVING A NOTCHED BASE

(75) Inventors: Akinori Yamada, Ina (JP); Shuhei Yoshida, Kamiina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/613,622

(22) Filed: Sep. 13, 2012

(65) Prior Publication Data

US 2013/0015921 A1    Jan. 17, 2013

Related U.S. Application Data

(63) Continuation of application No. 13/030,499, filed on Feb. 18, 2011.

(30) Foreign Application Priority Data

Feb. 25, 2010 (JP) ................................. 2010-039785
Dec. 1, 2010 (JP) ................................. 2010-268087

(51) Int. Cl.
*H03H 9/19* (2006.01)
*G04F 5/06* (2006.01)

(52) U.S. Cl.
CPC ......................................... *G04F 5/06* (2013.01)
USPC .............................................................. 310/370

(58) Field of Classification Search
CPC ............. H03H 9/19; H03H 9/21; H03H 9/215
USPC .......................................................... 310/370
See application file for complete search history.

(56) References Cited

U.S. PATENT DOCUMENTS

| | | | | |
|---|---|---|---|---|
| 5,608,770 | A * | 3/1997 | Noguchi et al. | 377/47 |
| 7,015,627 | B2 * | 3/2006 | Serizawa | 310/340 |
| 7,107,843 | B2 * | 9/2006 | Ohuchi et al. | 73/504.16 |
| 7,112,915 | B2 * | 9/2006 | Tanaya et al. | 310/370 |
| 7,436,107 | B2 * | 10/2008 | Aizawa et al. | 310/370 |
| 7,521,846 | B2 * | 4/2009 | Tanaya | 310/370 |
| 7,550,905 | B2 * | 6/2009 | Tanaya | 310/370 |
| 7,626,318 | B2 * | 12/2009 | Dalla Piazza et al. | 310/370 |
| 7,673,511 | B2 * | 3/2010 | Yamamoto | 73/504.16 |
| 7,759,848 | B2 | 7/2010 | Hirasawa | |
| 8,182,703 | B2 | 5/2012 | Yamada et al. | |
| 8,283,988 | B2 * | 10/2012 | Yamada et al. | 331/154 |

(Continued)

FOREIGN PATENT DOCUMENTS

| | | |
|---|---|---|
| JP | 2002-280870 | 9/2002 |
| JP | 2005-005896 A | 1/2005 |

(Continued)

*Primary Examiner* — J. San Martin
(74) *Attorney, Agent, or Firm* — Harness, Dickey & Pierce, P.L.C.

(57) ABSTRACT

A resonator element capable of improving impact resistance is provided. A quartz crystal resonator element is a resonator element formed by etching a Z plate which is cut at predetermined angles with respect to the crystal axes of a quartz crystal. The quartz crystal resonator element includes a base, a pair of resonating arms extending from the base in the Y-axis direction, and a positive X-axis notch and a negative X-axis notch formed by notching the base in the X-axis direction. The positive X-axis notch is formed by notching the base from the negative side of the X axis towards the positive side so that the width of the positive X-axis notch increases as it approaches the outer circumference.

44 Claims, 8 Drawing Sheets

(56) References Cited

U.S. PATENT DOCUMENTS

| | | | |
|---|---|---|---|
| 8,299,863 B2 * | 10/2012 | Tanaya et al. | 331/156 |
| 2005/0017604 A1 * | 1/2005 | Yamada | 310/370 |
| 2007/0068251 A1 | 3/2007 | Yamamoto | |
| 2008/0211350 A1 | 9/2008 | Tanaya et al. | |
| 2009/0115294 A1 | 5/2009 | Kikushima | |
| 2009/0289531 A1 | 11/2009 | Fang et al. | |
| 2011/0089788 A1 | 4/2011 | Kikushima | |
| 2012/0007684 A1 * | 1/2012 | Yamada | 331/156 |
| 2012/0017680 A1 | 1/2012 | Kikushima | |
| 2012/0075962 A1 * | 3/2012 | Arimatsu | 368/47 |
| 2012/0242194 A1 * | 9/2012 | Kikushima | 310/348 |
| 2013/0181580 A1 | 7/2013 | Kikushima | |

FOREIGN PATENT DOCUMENTS

| | | |
|---|---|---|
| JP | 2008-206079 | 9/2008 |
| JP | 2009-105509 | 5/2009 |
| JP | 2009-117939 A | 5/2009 |
| JP | 2009-118302 | 5/2009 |

* cited by examiner

| ANGLE (θ) | 0 | 3 | 4 | 5 | 10 | 15 | 30 | 35 | 37 | 40 |
|---|---|---|---|---|---|---|---|---|---|---|
| ETCHING SHAPE | × | ○ | ○ | ○ | ◎ | ◎ | ◎ | ○ | × | × |

| ANGLE (θ) | 0 | 10 | 20 | 30 |
|---|---|---|---|---|
| ETCHING SHAPE | X | O | O | O |

RESONATOR ELEMENT HAVING A NOTCHED BASE

CROSS REFERENCE TO RELATED APPLICATIONS

This application is a continuation application of U.S. Ser. No. 13/030,449 filed Feb. 18, 2011 which claims priority to Japanese Patent Application Nos. 2010-039785 filed Feb. 25, 2010 and 2010-268087 filed Dec. 1, 2010 all of which are incorporated by reference in their entireties.

BACKGROUND

1. Technical Field

The present invention relates to a resonator element, a resonator having the resonator element, an oscillator having the resonator element, and an electronic device having the resonator element.

2. Related Art

JP-A-2002-280870 discloses a resonator element which includes a base and a resonating arm portion (hereinafter, referred to as a resonating arm) protruding from the base, and in which a groove is formed in the resonating arm, and a cut-out portion (hereinafter, referred to as a notch) is formed in the base.

In the resonator element disclosed in JP-A-2002-280870, since a notch is formed in the base, a leakage of vibration from the resonating arm to the base decreases. Thus, it is possible to suppress fluctuation of the CI (Crystal Impedance) value (Q value).

The outer shape of the resonator element is generally formed by etching. A resonator element made from a quartz crystal has etching anisotropy: that is, the etching rate differs depending on the direction with respect to the quartz crystal axes of the quartz crystal.

Due to this etching anisotropy, the resonator element at the tip end of the notch in the base is over-etched (excessively etched). Thus, the notch goes further into the central side of the base from an original position. As a result, the notch has a shape, such as a wedge with an acute tip end, such that stress is likely to be concentrated on it.

When an impact, such as by being dropped, is applied to the resonator element, stress is concentrated on the tip end of the notch, and breaking may start from that portion.

SUMMARY

An advantage of some aspects of the invention is to solve at least a part of the problems described above and the invention can be implemented as the following forms or application examples.

APPLICATION EXAMPLE 1

According to this application example of the invention, there is provided a resonator element whose outer shape is formed by etching a Z plate which is cut at predetermined angles with respect to the mutually orthogonal X, Y, and Z axes which are the crystal axes of a quartz crystal, including: a base having a notch; and a resonating arm extending from the base, wherein the notch includes a positive X-axis notch formed by notching the base from the negative side of the X axis to the positive side, wherein a width in the Y-axis direction of the positive X-axis notch reaches the maximum at a negative X axis-side end of the positive X-axis notch, and wherein the base has a shape such that the width of the positive X-axis notch gradually decreases from the negative X axis-side end towards the positive side of the X axis.

According to this configuration, the resonator element includes the notch which includes the positive X-axis notch formed by notching the base from the negative side of the X axis towards the positive side.

Since the resonator element is provided with the notch in the above-mentioned direction, it is possible to suppress vibration leakage more effectively. Moreover, since the resonator element has a slope portion in the base, the etching rate changes at the tip end of the notch. Thus, it is possible to suppress over-etching.

As a result, since the concentration of stress in the tip end of the notch is suppressed in the resonator element, the strength of the base is improved. Thus, it is possible to improve impact resistance of the quartz crystal resonator element.

APPLICATION EXAMPLE 2

According to this application example, in the resonator element of the above application example, the base has a slope portion sloped so that the width of the positive X-axis notch decreases from the negative X axis-side end towards the positive side of the X axis.

According to this configuration, the base of the resonator element has the slope portion sloped so that the width of the positive X-axis notch decreases from the negative X axis-side end towards the positive side of the X axis. Since the resonator element is provided with the slope portion in the base, the etching rate changes at the tip end of the positive X-axis notch. Thus, it is possible to suppress over-etching.

As a result, since the concentration of stress in the tip end of the notch is suppressed in the resonator element, the strength of the base is improved. Thus, it is possible to improve impact resistance.

APPLICATION EXAMPLE 3

In the resonator element of the above application example, it is preferable that the slope portion is connected to one side of the notch positioned on the positive side of the Y axis, and the angle between the slope portion and the side is within the range of 3° to 35°.

According to this configuration, the resonator element is configured so that the angle between the slope portion and the side of the notch positioned on the positive side of the Y axis is within the range of 3° to 35°.

Since the resonator element is configured so that the angle between the slope portion and the side is within the above-mentioned range, it is possible to suppress over-etching effectively. The present inventors found the above-mentioned range from the analysis results of an etching simulation upon verification of compatibility with actual products.

APPLICATION EXAMPLE 4

In the resonator element of the above application example, it is preferable that the slope portion is connected to the other side of the notch positioned on the negative side of the Y axis, and an angle between the slope portion and the other side is within the range of 10° to 30°.

According to this configuration, the resonator element is configured so that the angle between the slope portion and the other side of the notch positioned on the negative side of the Y axis is within the range of 10° to 30°.

Since the resonator element is configured so that the angle between the slope portion and the other side is within the above-mentioned range, it is possible to suppress over-etching effectively. The present inventors found the above-mentioned range from the analysis results of an etching simulation after verification of compatibility with actual products.

APPLICATION EXAMPLE 5

In the resonator element of the above application example, it is preferable that the notch includes a negative X-axis notch formed by notching the base from the positive side of the X axis towards the negative side, and the positive X-axis notch and the negative X-axis notch are formed at the same position in the Y-axis direction.

According to this configuration, the resonator element is configured so that the notch is provided as a pair of notches including the positive X-axis notch and the negative X-axis notch and is formed in a symmetric shape with respect to the central line of the base along the extension direction of the resonating arm. Thus, it is possible to obtain a well-balanced vibration.

APPLICATION EXAMPLE 6

In the resonator element of the above application example, it is preferable that a plurality of the resonating arms is provided, and the plurality of resonating arms and the base form a tuning fork.

According to this configuration, the resonator element includes a plurality of the resonating arms, and the plurality of resonating arms and the base form a tuning fork. Thus, it is possible to provide a resonator element having improved impact resistance.

APPLICATION EXAMPLE 7

According to this application example of the invention, there is provided a resonator including: the resonator element of the above application example; and a package that accommodates the resonator element.

According to this configuration, since the resonator includes the resonator element having improved impact resistance, it is possible to improve impact resistance of the resonator.

APPLICATION EXAMPLE 8

According to this application example of the invention, there is provided an oscillator including: the resonator element of the above application example; a circuit element that has an oscillation circuit oscillating the resonator element; and a package that accommodates the resonator element and the circuit element.

According to this configuration, since the oscillator includes the resonator element having improved impact resistance, it is possible to improve impact resistance of the oscillator.

APPLICATION EXAMPLE 9

According to this application example of the invention, there is provided an electronic device including: the resonator element of the above application example; and a circuit element that has an oscillation circuit oscillating the resonator element.

According to this configuration, since the electronic device includes the resonator element having improved impact resistance, it is possible to improve the impact resistance of the electronic device.

BRIEF DESCRIPTION OF THE DRAWINGS

The invention will be described with reference to the accompanying drawings, wherein like numbers reference like elements.

FIGS. 1A and 1B are schematic views showing a simplified configuration of a resonator element according to a first embodiment, in which FIG. 1A is a top view, and FIG. 1B is a cross-sectional view of FIG. 1A.

FIGS. 4A and 4B are schematic views showing a simplified configuration of a resonator element according to a second embodiment, in which FIG. 4A is a top view, and FIG. 4B is a cross-sectional view of FIG. 4A.

FIGS. 7A and 7B are schematic views showing a simplified configuration of a resonator according to a third embodiment, in which FIG. 7A is a top view, and FIG. 7B is a cross-sectional view of FIG. 7A.

FIGS. 8A and 8B are schematic views showing a simplified configuration of an oscillator according to a fourth embodiment, in which FIG. 8A is a top view, and FIG. 8B is a cross-sectional view of FIG. 8A.

DESCRIPTION OF EXEMPLARY EMBODIMENTS

Figure 1A:
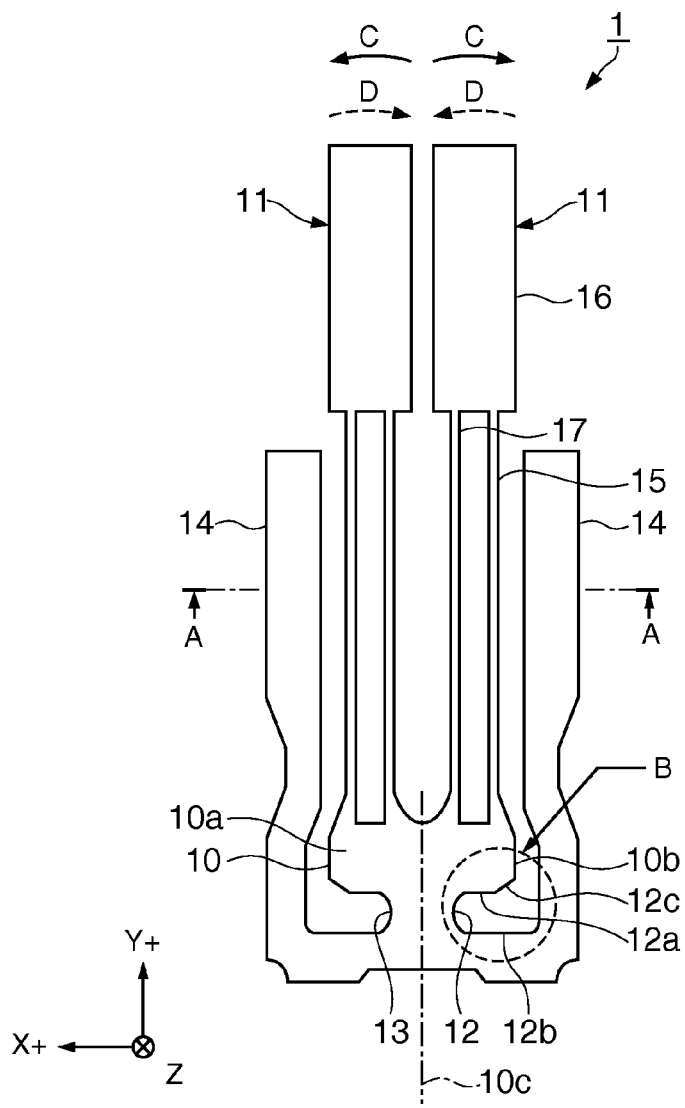
Figure 1B:
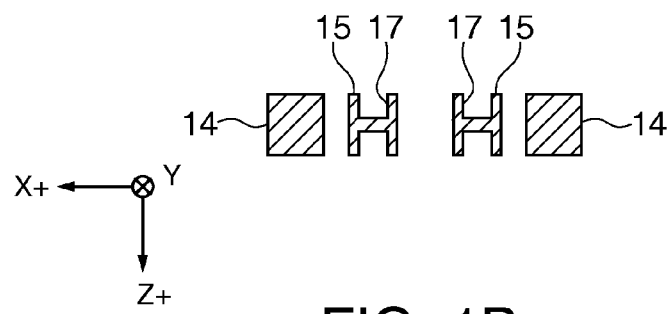
Figures 2, 3:
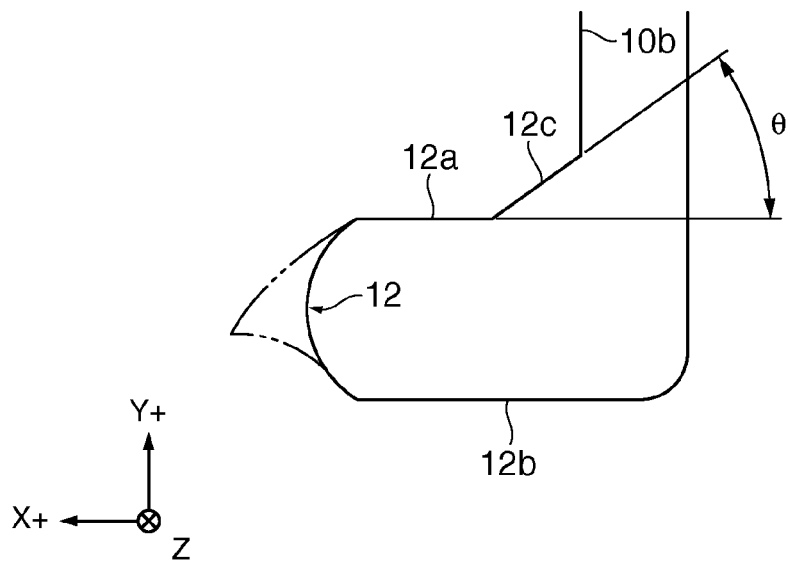
FIG. 2 is an enlarged view of a main part of FIG. 1A.
FIG. 3 is a table showing the relationship between an angle of a slope portion in a notch and an etching shape of a tip end.

Hereinafter, exemplary embodiments of the present invention will be described with reference to the drawings.
First Embodiment FIGS. 1A and 1B are schematic views showing a simplified configuration of a resonator element according to a first embodiment, in which FIG. 1A is a top view, and FIG. 1B is a cross-sectional view taken along the line IB-IB in FIG. 1A. FIG. 2 is an enlarged view of a "B" part in FIG. 1A.

As shown in FIGS. 1A and 1B, a quartz crystal resonator element 1 as a resonator element is a resonator element whose outer shape is formed by photolithographically etching (wet-etching) a Z plate which is cut, for example, from quartz crystal ore, at predetermined angles with respect to the mutually orthogonal X, Y, and Z axes which are the crystal axes of a quartz crystal. In this embodiment, etching is performed using an etching solution containing hydrofluoric acid.

Here, the Z plate means a plate whose cutting surface (principal surface 10a) is approximately orthogonal to the Z axis. Thus, the Z plate also includes a plate whose principal surface 10a orthogonal to the Z axis is cut in a state where the surface is rotated within the range of 0° to several degrees in the counterclockwise or clockwise direction from the Y axis to the Z axis as seen from the positive side of the X axis.

The quartz crystal resonator element 1 is cut from a single crystal of the quartz crystal so that the electrical axis is on the X axis, the mechanical axis is on the Y axis, and the optical axis is on the Z axis.

In the quartz crystal resonator element 1, a Z plate extending along the X-Y plane which exists on the X and Y axes and which is tilted at an angle of 0° to 5° around the X axis as seen from the intersection (the origin of coordinates) of the X and Y axes can be used.

The quartz crystal resonator element 1 allows the error of the cutting angle from the crystal within a certain range (for example, about 0° to 5°) with respect to each of the X, Y, and Z axes.

The quartz crystal resonator element 1 includes a base 10, a pair of resonating arms 11 extending approximately in parallel from the base 10 in the Y-axis direction, and a pair of supporting portions 14 protruding from the base 10 in the X-axis direction, bent towards the resonating arms 11, and extending in the Y-axis direction. In the base 10, a pair of notches which is notched in the X-axis direction is formed. That is, a positive X-axis notch 12 is notched from the negative side of the X axis towards the positive side, and a negative X-axis notch 13 is notched from the positive side of the X axis towards the negative side.

The quartz crystal resonator element 1 includes the base 10 and the pair of resonating arms 11 which form a tuning fork, whereby a tuning fork-type resonator element is obtained. The quartz crystal resonator element 1 is fixed to an external member such as a package through a mount electrode (not shown) formed at a predetermined position of each of the supporting portions 14.

The resonating arm 11 includes an arm portion 15 positioned close to the base 10, a weight portion 16 positioned further close to the tip end than the arm portion 15 and having a larger width than the arm portion 15, and a groove 17 formed along the extension direction (Y-axis direction) of the resonating arm 11 and cut along the arrangement direction (X-axis direction) of the pair of resonating arms 11 so that the resonating arm 11 has an H-shape in cross-sectional view.

In the quartz crystal resonator element 1, when an external driving signal is applied through the mount electrode to an excitation electrode (not shown) formed on the resonating arms 11, the pair of resonating arms 11 alternately vibrate (resonate) in the flexural mode at a predetermined frequency (for example, 32 kHz) in the directions indicated by the arrows C and D.

Next, the pair of notches (the positive X-axis notch 12 notched from the negative side of the X axis towards the positive side and the negative X-axis notch 13 notched from the positive side of the X axis towards the negative side) will be described in detail.

The positive X-axis notch 12 is formed by notching the base 10 from the negative side of the X axis towards the positive side.

As shown in FIG. 2, the base 10 has a slope portion 12c which is disposed between the outer circumference 10b of the base 10 and a side 12a as one side positioned close to the positive side of the Y axis, between the two sides 12a and 12b in the notching direction of the positive X-axis notch 12. The slope portion 12c is formed so that the width of the positive X-axis notch 12 increases as it approaches the outer circumference 10b. In other words, the positive X-axis notch 12 has a shape such that the width in the Y-axis direction of the positive X-axis notch 12 reaches the maximum at the position of the outer circumference 10b of the base 10 which is the negative X axis-side end of the positive X-axis notch 12, and the width gradually decreases from the outer circumference 10b which is the negative X axis-side end towards the positive side of the X axis.

As described above, the slope portion 12c is connected to the side 12a of the positive X-axis notch 12 positioned on the positive side of the Y axis, and the angle θ between the slope portion 12c and the side 12a is within the range of 3° to 35°.

On the other hand, as shown in FIG. 1A, the negative X-axis notch 13 is provided to be paired with the positive X-axis notch 12 and is formed in a symmetric shape to the positive X-axis notch 12 with respect to the central line 10c of the base 10 along the extension direction (Y-axis direction) of the resonating arm 11.

Next, the relationship between the angle θ of the slope portion 12c of the positive X-axis notch 12 and the etching shape of the tip end of the positive X-axis notch 12 will be described based on the analysis results of a simulation by the present inventors.

FIG. 3 is a table showing the relationship between the angle of a slope portion in a notch and an etching shape of a tip end.

The etching shape obtained through the simulation is evaluated into three grades: X (Poor), O (Good), and ⊚ (Excellent) in the descending order of the possibility of stress concentration. If the etching shape is evaluated as O or ⊚, it can be determined that stress concentration rarely occurred and the resonator elements can be used for mass-production.

As shown in FIG. 3, the etching shape is evaluated as O or better when the angle θ of the slope portion 12c is within the range of 3° to 35°, and particularly, is evaluated as ⊚ for the range of 10° to 30°. In contrast, the etching shape is evaluated as X when the angle θ of the slope portion 12c is 0°, 37°, and 40°.

According to the analysis results, the angle θ of the slope portion 12c is preferably in the range of 3° to 35°, and more preferably, in the range of 10° to 30°. Moreover, it is particularly preferable that the angle θ is about 30° from the perspective of the forming precision of the slope portion 12c which is influenced by etching anisotropy.

The etching shape obtained through the simulation will be described in detail. The two-dot chain line in FIG. 2 shows the shape of the tip end when there is no slope portion 12c (which is the shape obtained with the related art, and is the case where the angle θ in FIG. 3 is 0°).

In this case, the tip end of the positive X-axis notch 12 is so over-etched as to go further into the center side of the base 10 than the intended original circular-arc shape indicated by the solid line. As a result, the tip end has a shape, such as a wedge with an acute tip end, such that stress is likely to be concentrated on it.

In contrast, when the angle θ of the slope portion 12c is within the range of 3° to 35°, the etching rate changes at the tip end of the positive X-axis notch 12. Thus, the over-etching is suppressed. As a result, the tip end of the positive X-axis notch 12 has a shape close to the intended circular-arc shape indicated by the solid line.

As described above, the quartz crystal resonator element 1 according to the first embodiment has the positive X-axis notch 12 and the negative X-axis notch 13 which are formed by notching the base 10 in the X-axis direction. Moreover, the quartz crystal resonator element 1 has the slope portion 12c which is disposed between the outer circumference 10b of the base 10 and the side 12a of the positive X-axis notch 12 positioned close to the positive side of the Y axis among the two sides 12a and 12b in the notching direction of from the negative side of the X axis to the positive side, and which is formed so that the width of the positive X-axis notch 12 increases as it approaches the outer circumference 10b.

According to this configuration, since the quartz crystal resonator element 1 is provided with the positive X-axis notch 12 and the negative X-axis notch 13 in the above-mentioned direction, it is possible to suppress vibration leakage more effectively.

Moreover, since the quartz crystal resonator element 1 has the slope portion 12c in the positive X-axis notch 12, the etching rate changes at the tip end of the positive X-axis notch 12. Thus, it is possible to suppress over-etching.

As a result, since the concentration of stress in the tip end of the positive X-axis notch 12 is suppressed in the quartz crystal resonator element 1, the strength of the base 10 is improved. Thus, it is possible to improve the impact resistance of the quartz crystal resonator element 1.

Moreover, in the quartz crystal resonator element 1, when the angle $\theta$ between the slope portion 12c and the side 12a is within the range of 3° to 35°, it is possible to suppress over-etching effectively. When the angle $\theta$ between the slope portion 12c and the side 12a is within the range of 10° to 30°, it is possible to suppress over-etching more effectively.

Although the slope portion 12c is described as having a linear shape, the invention is not limited to this, and for example, the slope portion 12c may have a circular-arc shape, a stepped shape, and the like. In other words, the positive X-axis notch 12 may have a shape such that the width in the Y-axis direction of the positive X-axis notch 12 reaches the maximum at the negative X axis-side end (the outer circumference 10b of the base 10) of the positive X-axis notch 12 and gradually decreases from the negative X axis-side end (the outer circumference 10b of the base 10) towards the positive side of the X axis.

Moreover, the quartz crystal resonator element 1 is configured so that the positive X-axis notch 12 and the negative X-axis notch 13 are provided in a paired manner, and the positive X-axis notch 12 and the negative X-axis notch 13 are formed in a symmetric shape with respect to the central line 10c of the base 10 along the extension direction (Y-axis direction) of the resonating arm 11. Thus, it is possible to obtain a well-balanced flexural vibration.

Moreover, the quartz crystal resonator element 1 includes a pair (two) of resonating arms 11, and the two resonating arms 11 and the base 10 form a tuning fork. Thus, it is possible to provide a tuning fork-type resonator element having improved impact resistance.

Moreover, since the quartz crystal resonator element 1 is configured so that the tip end of the negative X-axis notch 13 is rarely over-etched due to etching anisotropy of a quartz crystal, the slope portion may not be provided in the negative X-axis notch 13.

Second Embodiment

Figure 4A:
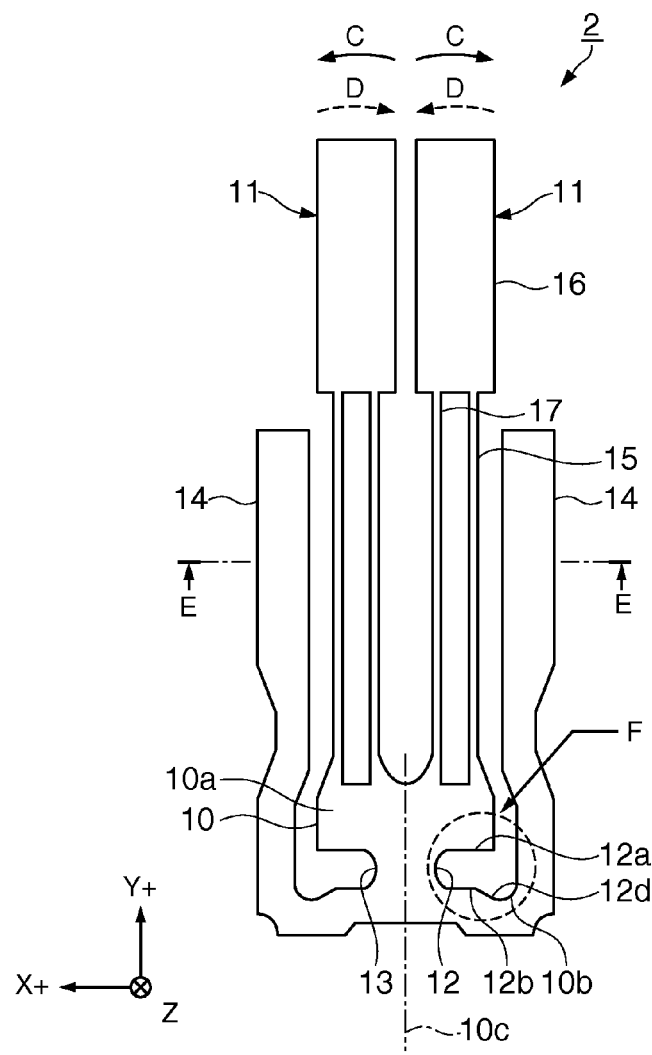
Figure 4B:
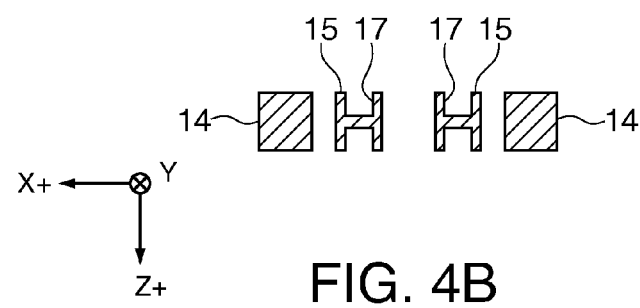
Figures 5, 6:
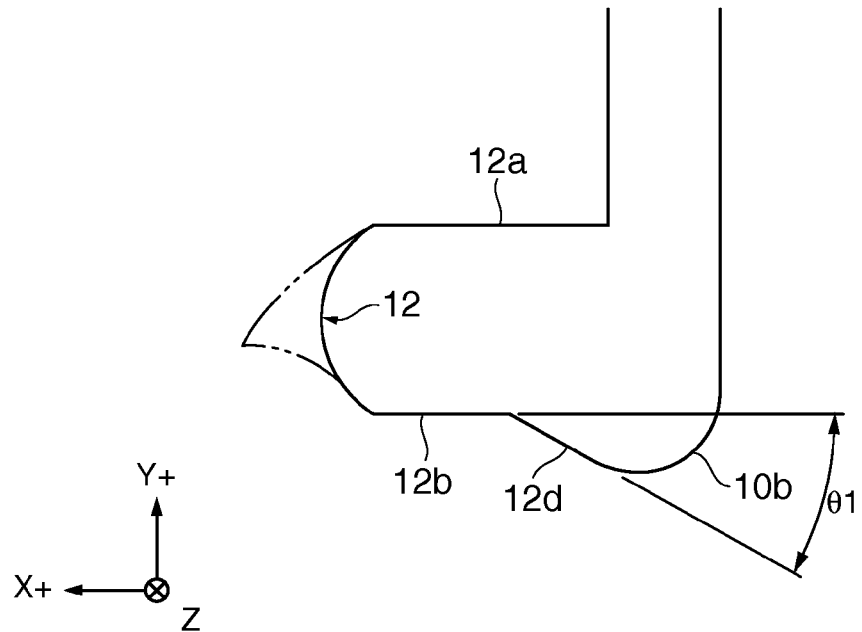
FIG. 5 is an enlarged view of a main part of FIG. 4A.
FIG. 6 is a table showing the relationship between an angle of a slope portion in a notch and an etching shape of a tip end.

FIGS. 4A and 4B are schematic views showing a simplified configuration of a resonator element according to a second embodiment used in an electronic device according to the invention, in which FIG. 4A is a top view, and FIG. 4B is a cross-sectional view taken along the line IVB-IVB in FIG. 4A. FIG. 5 is an enlarged view of a "F" part in FIG. 4A.

The same portions as the first embodiment will be denoted by the same reference numerals, and description thereof is omitted. In the following description, only the portions different from those of the first embodiment will be described.

As shown in FIGS. 4A and 4B, a quartz crystal resonator element 2 as a resonator element is different from that of the first embodiment, in that the positive X-axis notch 12 and the negative X-axis notch 13 are shaped differently.

As shown in FIG. 5, the base 10 of the quartz crystal resonator element 2 has a slope portion 12d which is disposed between an outer circumference 10b of the base 10 and a side 12b as the other side positioned close to the negative side of the Y axis, among the two sides 12a and 12b in the notching direction of the positive X-axis notch 12. The slope portion 12d is formed so that the width of the positive X-axis notch 12 increases as it approaches the outer circumference 10b. In other words, the positive X-axis notch 12 has a shape such that the width in the Y-axis direction of the positive X-axis notch reaches the maximum at the position of the outer circumference 10b of the base 10 which is the negative X axis-side end of the positive X-axis notch 12, and the width gradually decreases from the outer circumference 10b which is the negative X axis-side end towards the positive side of the X axis.

As described above, the slope portion 12d is connected to the side 12b of the positive X-axis notch 12 positioned on the negative side of the Y axis, and the angle $\theta1$ between the slope portion 12d and the side 12b is within the range of 10° to 30°.

On the other hand, as shown in FIG. 4A, the negative X-axis notch 13 is provided to be paired with the positive X-axis notch 12 and is formed in a symmetric shape to the positive X-axis notch 12 with respect to the central line 10c of the base 10 along the extension direction (Y-axis direction) of the resonating arm 11.

Next, the relationship between the angle $\theta1$ of the slope portion 12d of the positive X-axis notch 12 and the etching shape of the tip end of the positive X-axis notch 12 will be described based on the analysis results of a simulation by the present inventors.

FIG. 6 is a table showing the relationship between an angle of a slope portion in a notch and an etching shape of a tip end.

The etching shape obtained through the simulation is evaluated into two grades: X (Poor) and O (Good) in the descending order of the possibility of stress concentration. If the etching shape is evaluated as O, it can be determined that stress concentration rarely occurred and the resonator elements can be used for mass-production.

As shown in FIG. 6, the etching shape is evaluated as O when the angle $\theta1$ of the slope portion 12d is within the range of 10° to 30°. In contrast, the etching shape is evaluated as X when the angle $\theta1$ of the slope portion 12d is 0°.

According to the analysis results, the angle $\theta1$ of the slope portion 12d is preferably in the range of 10° to 30°.

The etching shape obtained through the simulation will be described in detail. The two-dot chain line in FIG. 5 shows the shape of the tip end when there is no slope portion 12d (which is the shape obtained with the related art, and is the case where the angle $\theta$ in FIG. 6 is 0°).

In this case, like the first embodiment, the tip end of the positive X-axis notch 12 is over-etched too much to go further into the center side of the base 10 than an intended original circular-arc shape indicated by the solid line. As a result, the tip end has a shape, such as a wedge with an acute tip end, such that stress is likely to be concentrated on it.

In contrast, when the angle $\theta1$ of the slope portion 12d is within the range of 10° to 30°, the etching rate changes at the tip end of the positive X-axis notch 12. Thus, the over-etching is suppressed. As a result, the tip end of the positive X-axis notch 12 has a shape close to the intended circular-arc shape indicated by the solid line.

As described above, the base 10 of the quartz crystal resonator element 2 according to the second embodiment has the slope portion 12d which is disposed between the outer circumference 10b of the base 10 and the side 12b of the positive X-axis notch 12 positioned close to the negative side of the Y axis among the two sides 12a and 12b in the notching direction, and which is formed so that the width of the positive X-axis notch 12 increases as it approaches the outer circumference 10b.

Moreover, the quartz crystal resonator element 2 is configured so that the angle θ1 between the slope portion 12d and the side 12b is within the range of 10° to 30°.

According to this configuration, in the quartz crystal resonator element 2, the etching rate changes at the tip end of the positive X-axis notch 12. Thus, it is possible to suppress over-etching.

As a result, since the concentration of stress in the tip end of the positive X-axis notch 12 is suppressed in the quartz crystal resonator element 2, the strength of the base 10 is improved. Thus, it is possible to improve the impact resistance of the quartz crystal resonator element 2.

Moreover, since the quartz crystal resonator element 2 is configured so that the tip end of the negative X-axis notch 13 is rarely over-etched due to etching anisotropy of a quartz crystal, the slope portion may not be provided in the negative X-axis notch 13.

Although in the embodiments described above, the number of resonating arms 11 has been set to be two, the invention is not limited to this, the number of resonating arms 11 may be one or three or more.

Moreover, the supporting portion 14, the weight portion 16, and the groove 17 may not be provided. Moreover, the direction of the flexural vibration of the resonating arm 11 may be the thickness direction (Z-axis direction) of the resonating arm 11. Furthermore, the slope portion 12c and the slope portion 12d may be provided together.

Third Embodiment

Next, a resonator having the quartz crystal resonator element described above will be described as a third embodiment.

Figure 7A:
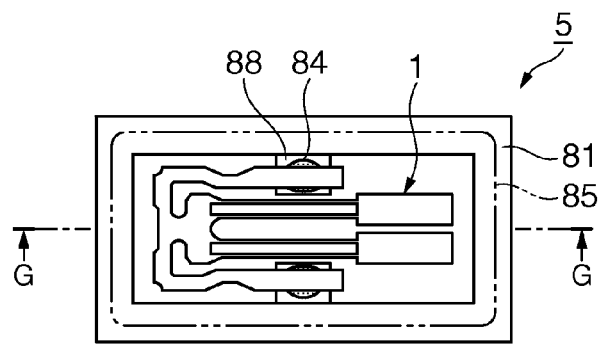
Figure 7B:
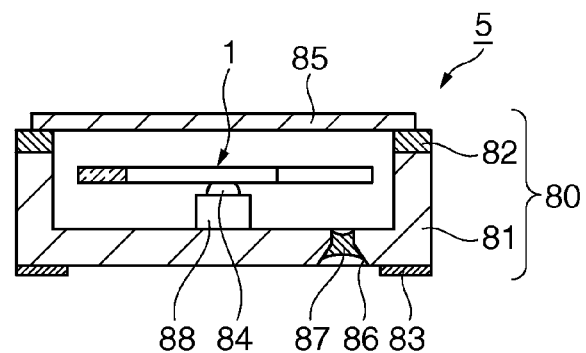

FIGS. 7A and 7B are schematic views showing a simplified configuration of a resonator according to a third embodiment, in which FIG. 7A is a top view, and FIG. 7B is a cross-sectional view taken along the line VIIB-VIIB in FIG. 7A.

As shown in FIGS. 7A and 7B, a quartz crystal resonator 5 as a resonator includes the quartz crystal resonator element 1 of the first embodiment and a package 80 that accommodates the quartz crystal resonator element 1.

The package 80 includes a package base 81, a seam ring 82, a cover 85, and the like.

The package base 81 has a recess so that the quartz crystal resonator element 1 can be accommodated therein, and connection pads 88 connected to the mount electrodes (not shown) of the quartz crystal resonator element 1 are provided in the recess.

The connection pads 88 are connected to wirings inside the package base 81 so as to be electrically connected to an external connection terminal 83 provided at the periphery of the package base 81.

The seam ring 82 is provided around the recess of the package base 81. A penetration hole 86 is provided on the bottom of the package base 81.

The quartz crystal resonator element 1 is attached and fixed to the connection pads 88 of the package base 81 by a conductive adhesive 84. In the package 80, the cover 85 covering the recess of the package base 81 is seam-welded to the seam ring 82.

A sealing material 87 made from a metal material or the like is filled in the penetration hole 86 of the package base 81. The sealing material 87 is melted in a depressurized atmosphere and solidified to airtightly seal the penetration hole 86 so that the inside of the package base 81 is maintained in the depressurized state.

The quartz crystal resonator 5 oscillates at a predetermined frequency (for example, 32 kHz) when the quartz crystal resonator element 1 is excited by an external driving signal supplied through the external connection terminal 83.

As described above, since the quartz crystal resonator 5 includes the quartz crystal resonator element 1 having improved impact resistance, it is possible to improve the impact resistance of the quartz crystal resonator 5.

The same advantage can be obtained when the quartz crystal resonator 5 includes the quartz crystal resonator element 2 in place of the quartz crystal resonator element 1.

Fourth Embodiment

Next, an oscillator having the quartz crystal resonator element described above will be described as a fourth embodiment.

Figure 8A:
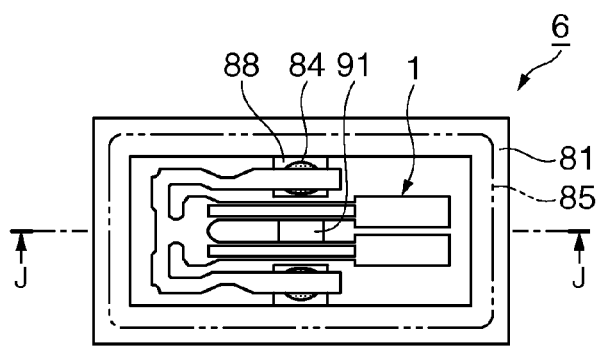
Figure 8B:
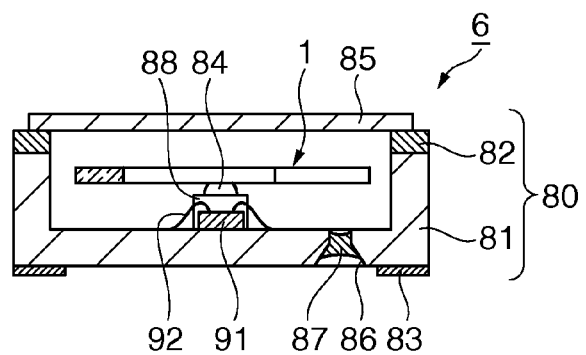

FIGS. 8A and 8B are schematic views showing a simplified configuration of an oscillator according to a fourth embodiment, in which FIG. 8A is a top view, and FIG. 8B is a cross-sectional view taken along the line VIIIB-VIIIB in FIG. 8A.

A crystal oscillator 6 as an oscillator has a configuration in which the quartz crystal resonator 5 described above further includes a circuit element. The same portions as the quartz crystal resonator 5 will be denoted by the same reference numerals, and description thereof is omitted.

As shown in FIGS. 8A and 8B, the crystal oscillator 6 includes the quartz crystal resonator element 1 of the first embodiment, an IC chip 91 as a circuit element having an oscillation circuit that oscillates the quartz crystal resonator element 1, and the package 80 that accommodates the quartz crystal resonator element 1 and the IC chip 91.

The IC chip 91 is attached to the bottom of the package base 81 and is connected to other wirings by metal wires 92 such as gold wires.

The crystal oscillator 6 oscillates at a predetermined frequency (for example, 32 kHz) when the quartz crystal resonator element 1 is excited by a driving signal supplied from the oscillation circuit of the IC chip 91.

As described above, since the crystal oscillator 6 includes the quartz crystal resonator element 1 having improved impact resistance, it is possible to improve the impact resistance of the crystal oscillator 6.

The same advantage can be obtained when the crystal oscillator 6 includes the quartz crystal resonator element 2 in place of the quartz crystal resonator element 1.

Electronic Device

The quartz crystal resonator elements of the respective embodiments described above can be applied to various electronic devices, and such electronic devices have high reliability. In this electronic device, the resonator and oscillator described in the embodiments may be used.

Figure 9:
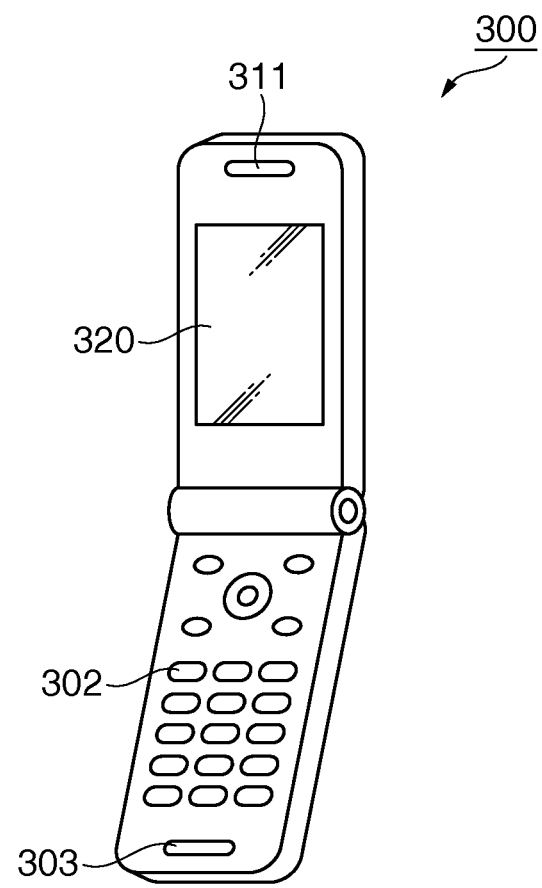
FIG. 9 is a perspective view showing a simplified configuration of a portable phone as an example of an electronic device according to the invention.
Figure 10:
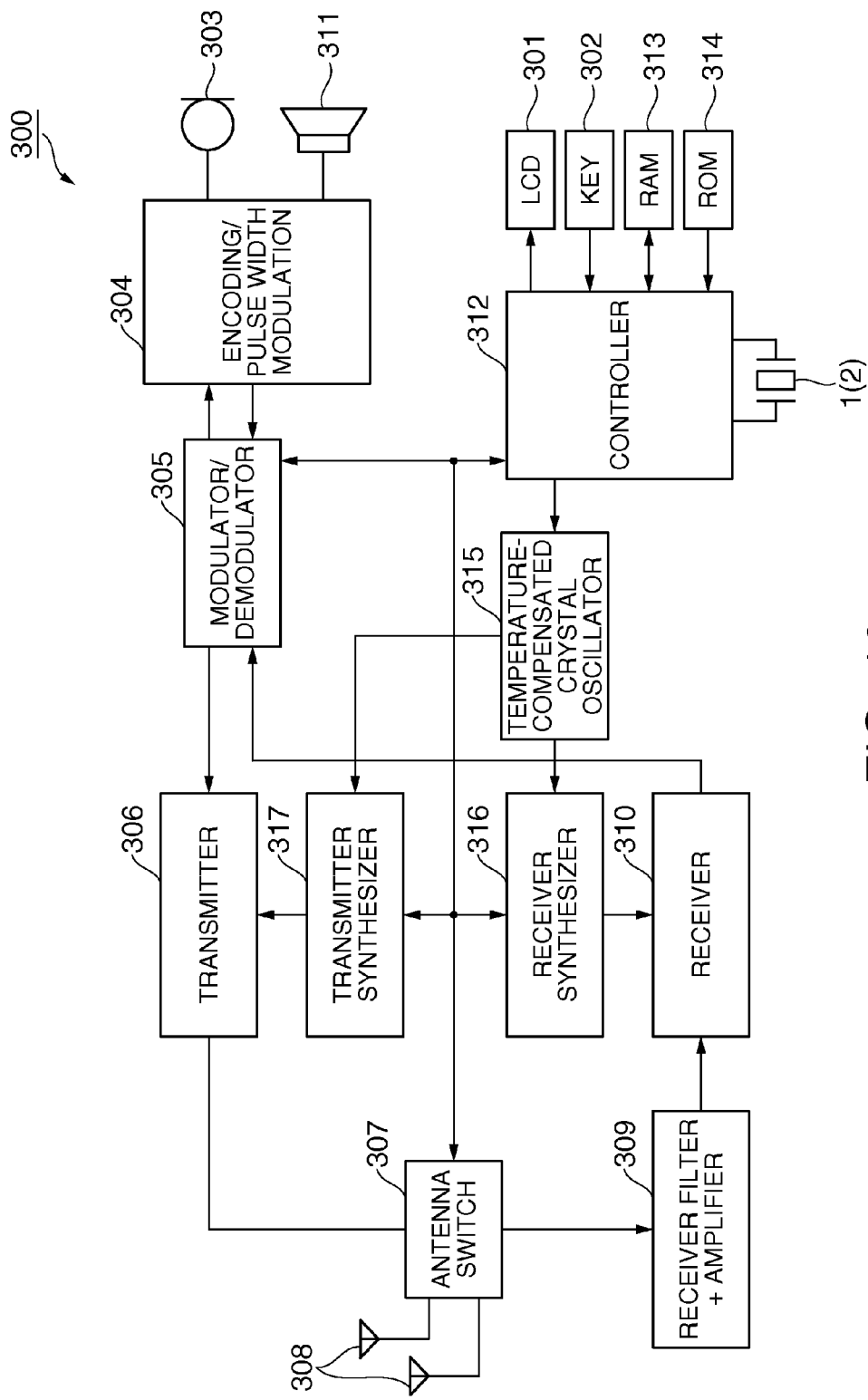
FIG. 10 is a circuit block diagram of the portable phone as an example of an electronic device according to the invention.

FIGS. 9 and 10 show a portable phone as an example of an electronic device according to the invention. FIG. 9 is a perspective view showing a simplified external appearance of the portable phone, and FIG. 10 is a circuit block diagram illustrating the circuit portion of the portable phone.

A portable phone 300 may use the quartz crystal resonator element 1 or 2 described above. In this example, an example where the quartz crystal resonator element 1 is used will be described. Moreover, further description of the configuration and action of the quartz crystal resonator element 1 will be omitted by using the same reference numerals as used in the above described embodiment.

As shown in FIG. 9, the portable phone 300 includes an LCD (Liquid Crystal Display) 301 which is a display section, a key 302 which is an input section for inputting numbers or the like, a microphone 303, a speaker 311, a circuit portion (not shown) which includes the oscillation circuit that oscillates the quartz crystal resonator element 1, and the like.

As shown in FIG. 10, when a user inputs his/her voice into the microphone 303 to perform communication using the portable phone 300, the voice signals are transmitted from an antenna 308 through a pulse-width modulation/encoding block 304, a modulator/demodulator block 305, a transmitter 306, and an antenna switch 307.

On the other hand, signals transmitted from a counterpart phone are received by the antenna 308 and input to the modulator/demodulator block 305 through the antenna switch 307, a receiver filter 309, and a receiver 310. Moreover, the modulated or demodulated signals are output from the speaker 311 as a sound through the pulse-width modulation/encoding block 304.

A controller 312 is provided so as to control the antenna switch 307, the modulator/demodulator block 305, and the like.

In addition to the above-mentioned components, the controller 312 controls the LCD 301 which is a display section and the key 302 which is an input section for inputting numbers or the like, and further controls a RAM 313, a ROM 314, and the like. Thus, higher precision is demanded. Moreover, there is also demand for miniaturization of the portable phone 300.

To meet such a demand, the above-described quartz crystal resonator element 1 is used.

The portable phone 300 also includes a temperature-compensated crystal oscillator 315, a receiver synthesizer 316, a transmitter synthesizer 317, and the like as its constituent blocks, and description thereof is omitted.

Since the quartz crystal resonator element 1 used in the portable phone 300 is provided with the notch in the base 10, it is possible to suppress vibration leakage more effectively. Moreover, since the quartz crystal resonator element 1 has the slope portion 12*c* in the notch, the etching rate changes at the tip end of the notch. Thus, it is possible to suppress overetching.

As a result, since the concentration of stress in the tip end of the notch is suppressed in the quartz crystal resonator element 1, the strength of the base 10 is improved. Thus, it is possible to improve the impact resistance of the quartz crystal resonator element 1.

Therefore, the electronic device (the portable phone 300) using the quartz crystal resonator element 1 has stable characteristics, and the impact resistance thereof can be improved.

Figure 11:
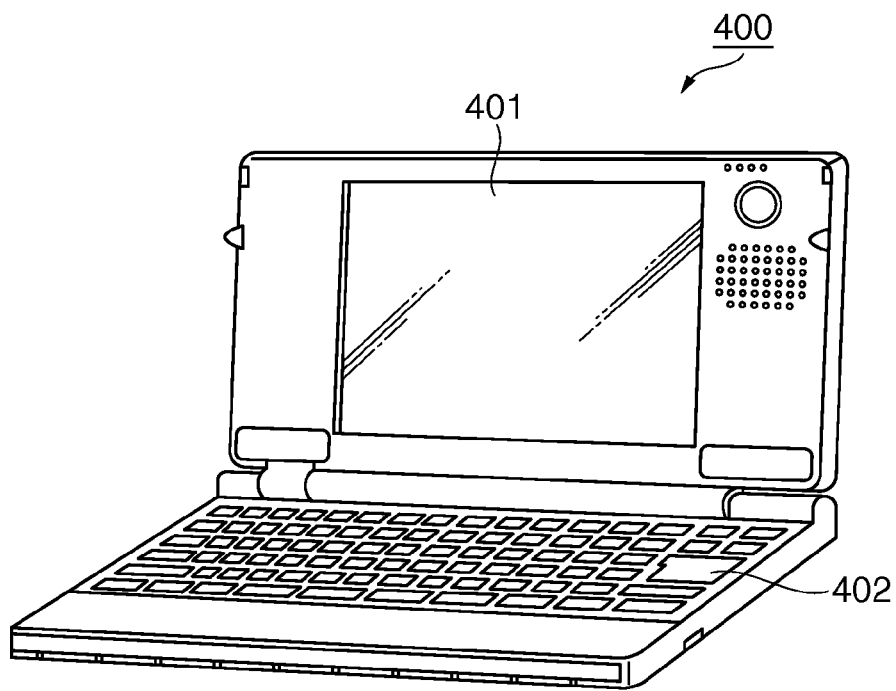
FIG. 11 is a perspective view showing a simplified configuration of a personal computer as an example of an electronic device according to the invention.

FIG. 11 shows a personal computer (mobile personal computer) 400 as another example of the electronic device having the quartz crystal resonator element 1 according to the invention. The personal computer 400 includes a display section 401, an input key section 402, and the like, and the quartz crystal resonator element 1 described above is used as a reference clock for controlling the electrical operation thereof.

In addition to the above-mentioned examples, examples of the electronic device having the quartz crystal resonator element 1 according to the invention include a digital-still camera, an ink jet ejection apparatus (for example, an ink jet printer), a laptop personal computer, a television, a video camera, a video tape recorder, a car navigation apparatus, a pager, an electronic pocket book (including one with communication capability), an electronic dictionary, a calculator, an electronic game machine, a word processor, a work station, a television phone, a surveillance TV monitor, electronic binoculars, a POS terminal, a medical device (for example, an electronic thermometer, a sphygmomanometer, a glucose meter, an electrocardiogram measuring system, an ultrasonic diagnosis device, and an electronic endoscope), a fish finder, various measurement instruments, various indicators (for example, indicators used in vehicles, airplanes, and ships), a flight simulator, and the like.

While the electronic device according to the invention has been described based on the embodiments, the invention is not limited to the embodiments, the configuration of the respective portions, units, and sections can be replaced with any configuration having the same function. Moreover, other arbitrary constituent elements may be added to the invention. Furthermore, arbitrary two or more configurations (features) among the respective embodiments may be combined with each other to implement the invention.

For example, although in the embodiments described above, a case where the quartz crystal resonator element has two resonating arms as the vibrating portions was described, the number of resonating arms may be three or more.

Moreover, the quartz crystal resonator element described in the embodiment may be applied to a gyro sensor or the like, in addition to a piezoelectric oscillator such as a voltage-controlled crystal oscillator (VCXO), a temperature-compensated crystal oscillator (TCXO), or an oven-controlled crystal oscillator (OCXO).

What is claimed is:

1. A resonator element, comprising:
a base that has:
a notch and a connection section that are provided next to each other in a first direction;
a first base part connected to the connection section at one side of the connection section; and
a second base part connected to the connection section at another side of the connection section; and
a resonating arm that extends from the first part of the base in a second direction intersecting with the first direction, wherein
the notch extends from a side surface of the connection section in the first direction,
a first outer periphery of the first base part and a second outer periphery of the second base part define the notch, and the first and second outer peripheries extend from the side surface of the connection section to an open end of the notch,
the notch has a first space, which has a first notch width between the first and second outer peripheries in the second direction, proximate the side surface of the connection section, a second space, which has a second notch width between the first and second outer peripheries in the second direction, proximate the open end of the notch, and a third space, which has a third notch width between the first and second outer peripheries in the second direction, therebetween, and
a third angle between the first outer periphery located in the third space and a first imaginary line extending in the first direction is smaller than first and second angles respectively between second and third imaginary lines parallel to the first imaginary line and the first outer periphery respectively located in the first and second spaces.

2. The resonator element according to claim 1, wherein the first notch width is smaller than the third notch width, and
the third notch width is smaller than the second notch width.

3. The resonator element according to claim 2, wherein the resonator element is a tuning fork quartz crystal resonator element.

4. A resonator comprising:
the resonator element according to claim 2; and
a package that accommodates the resonator element.

5. An oscillator comprising:
the resonator element according to claim 2; and
a circuit element that has an oscillation circuit oscillating the resonator element; and
a package that accommodates the resonator element and the circuit element.

6. An electronic device comprising:
the resonator element according to claim 2.

7. The resonator element according to claim 3, further comprising:
a groove extending in the resonating arm in the second direction.

8. A resonator comprising:
the resonator element according to claim 3; and
a package that accommodates the resonator element.

9. An oscillator comprising:
the resonator element according to claim 3; and
a circuit element that has an oscillation circuit oscillating the resonator element; and
a package that accommodates the resonator element and the circuit element.

10. An electronic device comprising:
the resonator element according to claim 3.

11. A resonator comprising:
the resonator element according to claim 7; and
a package that accommodates the resonator element.

12. An oscillator comprising:
the resonator element according to claim 7; and
a circuit element that has an oscillation circuit oscillating the resonator element; and
a package that accommodates the resonator element and the circuit element.

13. An electronic device comprising:
the resonator element according to claim 7.

14. The resonator element according to claim 1, wherein the resonator element is a tuning fork quartz crystal resonator element.

15. The resonator element according to claim 14, further comprising:
a groove extending in the resonating arm in the second direction.

16. A resonator comprising:
the resonator element according to claim 15; and
a package that accommodates the resonator element.

17. An oscillator comprising:
the resonator element according to claim 15; and
a circuit element that has an oscillation circuit oscillating the resonator element; and
a package that accommodates the resonator element and the circuit element.

18. An electronic device comprising:
the resonator element according to claim 15.

19. A resonator comprising:
the resonator element according to claim 14; and
a package that accommodates the resonator element.

20. An oscillator comprising:
the resonator element according to claim 14; and
a circuit element that has an oscillation circuit oscillating the resonator element; and
a package that accommodates the resonator element and the circuit element.

21. An electronic device comprising:
the resonator element according to claim 14.

22. A resonator comprising:
the resonator element according to claim 1; and
a package that accommodates the resonator element.

23. An oscillator comprising:
the resonator element according to claim 1; and
a circuit element that has an oscillation circuit oscillating the resonator element; and
a package that accommodates the resonator element and the circuit element.

24. An electronic device comprising:
the resonator element according to claim 1.

25. A resonator element, comprising:
a base; and
a resonating arm extending from the base, wherein
a side surface of the base includes a notch, the notch extending into the base beyond a longitudinal axis of the resonating arm, and
at least one sidewall of the notch is gradually radiused so that a width of the notch increases from a closed end of the notch to an open end of the notch.

26. The resonator element according to claim 25, wherein the resonating arm extends in a direction substantially perpendicular to the notch.

27. A resonator comprising:
the resonator element according to claim 26; and
a package that accommodates the resonator element.

28. An oscillator comprising:
the resonator element according to claim 26; and
a circuit element that has an oscillation circuit oscillating the resonator element; and
a package that accommodates the resonator element and the circuit element.

29. An electronic device comprising:
the resonator element according to claim 26.

30. The resonator element according to claim 25, wherein the base has a base center line, and
the closed end of the notch is located between the base center line and the longitudinal axis of the resonator arm.

31. A resonator comprising:
the resonator element according to claim 30; and
a package that accommodates the resonator element.

32. An oscillator comprising:
the resonator element according to claim 30; and
a circuit element that has an oscillation circuit oscillating the resonator element; and
a package that accommodates the resonator element and the circuit element.

33. An electronic device comprising:
the resonator element according to claim 30.

34. The resonator element according to claim 25, wherein the resonator element is a tuning fork quartz crystal resonator.

35. A resonator comprising:
the resonator element according to claim 34; and
a package that accommodates the resonator element.

36. An oscillator comprising:
the resonator element according to claim 34; and
a circuit element that has an oscillation circuit oscillating the resonator element; and
a package that accommodates the resonator element and the circuit element.

37. An electronic device comprising:
the resonator element according to claim 34.

38. The resonator element according to claim 25, further comprising:
a groove extending in a longitudinal direction of the resonating arm.

39. A resonator comprising:
the resonator element according to claim 38; and
a package that accommodates the resonator element.

40. An oscillator comprising:
the resonator element according to claim 38; and
a circuit element that has an oscillation circuit oscillating the resonator element; and
a package that accommodates the resonator element and the circuit element.

41. An electronic device comprising:
the resonator element according to claim 38.

42. A resonator comprising:
the resonator element according to claim 25; and
a package that accommodates the resonator element.

43. An oscillator comprising:
the resonator element according to claim 25; and
a circuit element that has an oscillation circuit oscillating the resonator element; and
a package that accommodates the resonator element and the circuit element.

44. An electronic device comprising:
the resonator element according to claim 25.

\* \* \* \* \*

UNITED STATES PATENT AND TRADEMARK OFFICE
CERTIFICATE OF CORRECTION

PATENT NO. : 8,598,770 B2
APPLICATION NO. : 13/613622
DATED : December 3, 2013
INVENTOR(S) : Akinori Yamada and Shuhei Yoshida Page 1 of 1

It is certified that error appears in the above-identified patent and that said Letters Patent is hereby corrected as shown below:

On the Title Page, Item (63) Related U.S. Application Data

"Continuation of application No. 13/030,499, filed on February 18, 2011" should be
--Continuation of application No. 13/030,449, filed on February 18, 2011.--

Signed and Sealed this
Twenty-second Day of April, 2014

Michelle K. Lee
*Deputy Director of the United States Patent and Trademark Office*